United States Patent
Banaska et al.

(10) Patent No.: US 7,800,380 B1
(45) Date of Patent: Sep. 21, 2010

(54) HIGH CAPACITANCE LOAD TESTING

(75) Inventors: John G. Banaska, Wadsworth, OH (US); Gregory Roberts, Cleveland, OH (US)

(73) Assignee: Keithley Instruments Inc., Cleveland, OH (US)

( * ) Notice: Subject to any disclaimer, the term of this patent is extended or adjusted under 35 U.S.C. 154(b) by 194 days.

(21) Appl. No.: 11/844,615

(22) Filed: Aug. 24, 2007

(51) Int. Cl.
*G01R 27/08* (2006.01)
(52) U.S. Cl. .................. 324/713; 324/693; 324/701
(58) Field of Classification Search .......... 324/713, 324/382, 548, 693, 695, 696, 701
See application file for complete search history.

(56) References Cited

U.S. PATENT DOCUMENTS

| | | | | |
|---|---|---|---|---|
| 3,726,285 A * | 4/1973 | Bowers et al. | ............... | 607/27 |
| 5,812,687 A * | 9/1998 | Onetti et al. | ............... | 381/97 |
| 6,008,630 A * | 12/1999 | Prasad | ............... | 323/222 |
| 6,163,139 A * | 12/2000 | Symonds | ............... | 323/222 |
| 6,366,068 B1 * | 4/2002 | Morishita | ............... | 323/282 |
| 6,724,257 B2 * | 4/2004 | Wrathall | ............... | 330/253 |
| 6,809,938 B2 * | 10/2004 | Lin et al. | ............... | 363/17 |
| 7,183,737 B2 * | 2/2007 | Kitagawa | ............... | 318/599 |
| 2007/0170931 A1 * | 7/2007 | Snyder | ............... | 324/658 |

* cited by examiner

*Primary Examiner*—Timothy J Dole
*Assistant Examiner*—Farhana Hoque
(74) *Attorney, Agent, or Firm*—Pearne & Gordon LLP

(57) ABSTRACT

A circuit for controlling a voltage across a device and permitting measurement of a current through the device includes a sense impedance in series combination with, the device, a sensed voltage measured across the sense impedance being representative of the current through the device; a capacitive stability element in parallel combination with the sense resistance, the capacitive stability element being virtually absent by connection to a virtual version of the sensed voltage when the device has a first capacitance and being present when the device has a second capacitance, the second capacitance being larger than the first capacitance.

2 Claims, 1 Drawing Sheet

HIGH CAPACITANCE LOAD TESTING

BACKGROUND OF THE INVENTION

The present invention relates to the measurement of electrical signals and, in particular, to the measurement of current in response to an applied voltage.

It is common to apply a known voltage to a device under test (DUT) and to measure the resulting current. In particular, the potential at the DUT may be fed back to a voltage source control to ensure that the desired voltage is applied to the DUT. A sense resistor in series with the DUT is used to sense a voltage that is proportional to the current through the DUT. The feedback loop bandwidth is chosen to provide a stable loop with an acceptable time for transients to settle.

In many cases of interest, the DUT has a substantial capacitive component (e.g., greater than 10 uF). When such a high capacitance DUT is encountered by a measurement system configured for low capacitance DUTs, the capacitance of such a high capacitance DUT will often result in the overall measurement system becoming unstable.

SUMMARY OF THE INVENTION

A circuit for controlling a voltage across a device and permitting measurement of a current through the device includes a sense impedance in series combination with the device, a sensed voltage measured across the sense impedance being representative of the current through the device; a capacitive stability element in parallel combination with the sense resistance, the capacitive stability element being virtually absent by connection to a virtual version of the sensed voltage when the device has a first capacitance and being present when the device has a second capacitance, the second capacitance being larger than the first capacitance.

DESCRIPTION OF THE PREFERRED EMBODIMENTS

Figure 1:
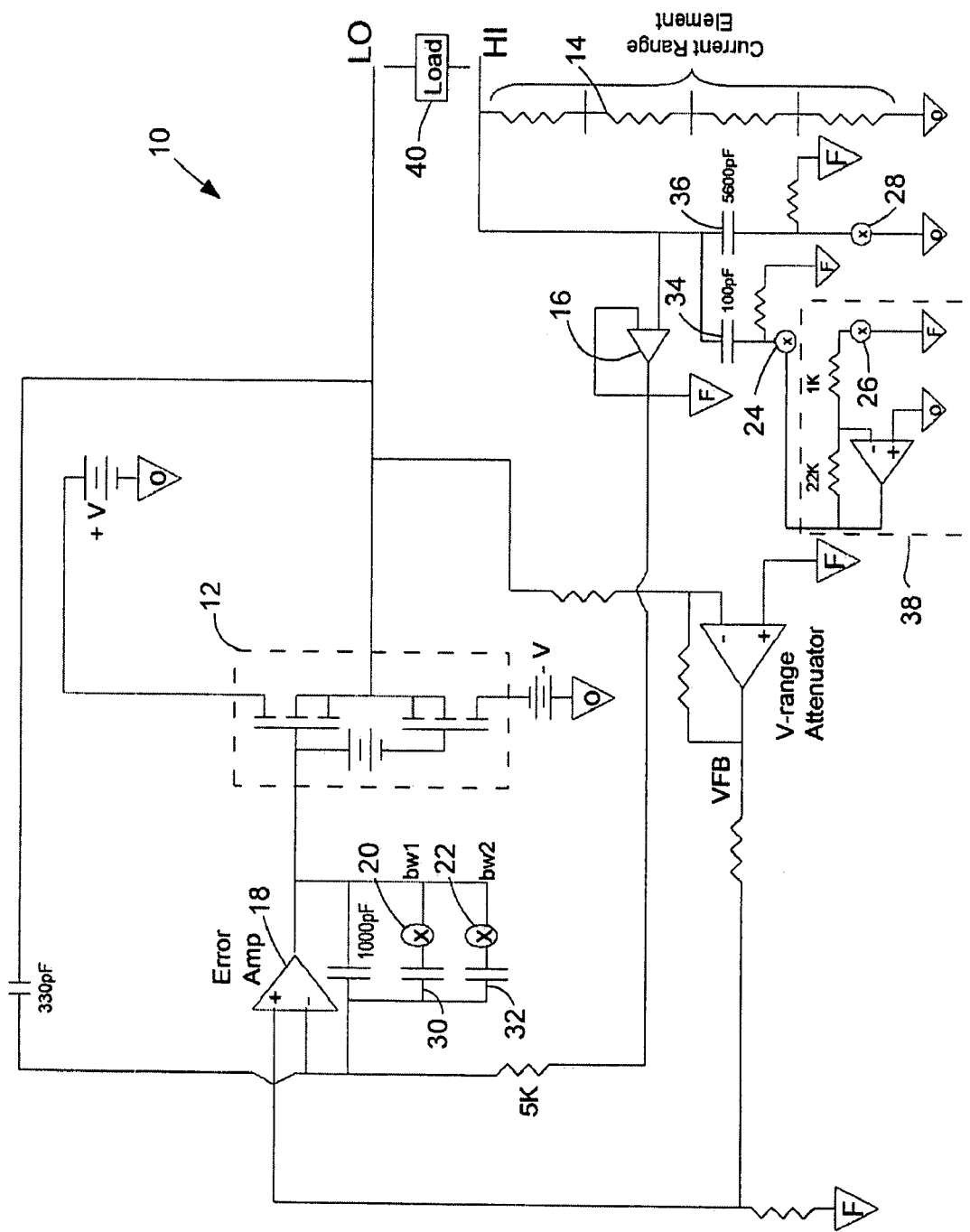
FIG. 1 is a schematic diagram of an example of a circuit according to the invention

Referring to FIG. 1, a circuit 10 includes an output stage 12 that applies a voltage across a device 40 connected in series with a sense impedance 14. The voltage across the device 40 is fed back through a buffer 16 to an error amplifier 18. The buffer 16 provides a virtual version of the voltage across the device 40. The error amplifier 18 drives the output stage 12 as required to force the voltage across the device 40 to a desired value as applied to the non-inverting input of the error amplifier 18. The circuit 10, as described, is stable where the capacitive component of the device 40 is relatively low (e.g., less than 10 uF, or other capacitive limit on stability). The voltage across the sense impedance 14 is related to the current through the device 40. For example, for a resistive sense impedance, the current would be the voltage measured across the impedance divided by the resistance of the impedance.

In this mode, the switches 20, 22, 24, 26, 28 are open. As a result, the feedback paths 30, 32 are open, providing the most loop gain bandwidth for the error amplifier 18. Further, the capacitors 34, 36 are merely connected between the voltage across the device 40 and the virtual version of the voltage at point F, resulting in the capacitors 34, 36 being virtually absent from the circuit 10 because there is no potential across them.

If the device 40 has a capacitive component that makes the circuit 10 unstable (e.g., greater than 10 uF, or other capacitive limit on stability), one or more of the switches 20, 22, 24, 26, 28 may be closed to ensure stable operation. The switches 20, 22, 24, 26, 28 may be, for example, manual switches or relays and electronic equivalents thereof.

If the switch 28 is closed, the capacitor 36 is fully connected in parallel with the sense impedance 14 resulting in improved stability.

Similarly, if the switches 24, 26 are closed, the capacitor 34 and a capacitance multiplier 38 are connected in parallel with the sense impedance 14, resulting in improved stability. The capacitance multiplier 38 progressively bootstraps the capacitor 34 so that it appears substantially larger than it is (e.g., 23 times larger). Use of the multiplier is desirable because it has been found that when the switch 24 is open and the capacitor 24 is virtually absent, a noise component directly related to the value of the capacitor 34 is present. Thus a smaller value of capacitance results in less noise, while the multiplier makes up for the reduced value when the switches are closed.

When one or more of the switches 20, 22 are closed, the respective feedback paths 30, 32 reduce the loop gain bandwidth for the error amplifier 18. This allows the stable measurement of devices having larger capacitive components. Rather than discrete values, the feedback paths may be, for example, continuously varied by electrically controlled impedances.

Using the techniques set forth above, it is possible to use the circuit 10 for both the fast measurement of low capacitance loads and the stable measurement of loads having large capacitive components (e.g., power supply circuits with large filter capacitors). The elements can be added or removed either manually or under the control of software or other electronic control. While the above examples have discrete values, it is also possible, for example, to use more continuously variable elements.

It should be evident that this disclosure is by way of example and that various changes may be made by adding, modifying or eliminating details without departing from the fair scope of the teaching contained in this disclosure. The invention is therefore not limited to particular details of this disclosure except to the extent that the following claims are necessarily so limited.

What is claimed is:

1. A circuit for controlling a voltage across a device and permitting measurement of a current through the device, said circuit comprising:
   a sense impedance in series combination with said device, a sensed voltage measured across said sense impedance being representative of said current through the device;
   a capacitive stability element in parallel combination with said sense resistance, said capacitive stability element being virtually absent by connection to a virtual version of said sensed voltage when said device has a first capacitance and being present when said device has a second capacitance, said second capacitance being larger than said first capacitance, wherein said capacitive stability element includes a capacitance multiplying circuit when said device has said known second capacitance.

2. A circuit according to claim 1, further comprising an error amplifier for controlling said voltage across said device, said error amplifier having an adjustable loop gain bandwidth, said bandwidth being adjusted in inverse relationship to the capacitance of said device.

* * * * *